US009623810B2

(12) United States Patent
Macquet

(10) Patent No.: US 9,623,810 B2
(45) Date of Patent: Apr. 18, 2017

(54) DEVICE FOR POSITIONING AND SECURING A DISPLAY ELEMENT AND DISPLAY DEVICE

(71) Applicant: Johnson Controls Automotive Electronics SAS, Cergy Pontoise (FR)

(72) Inventor: Eric Macquet, Saint Leu la Forêt (FR)

(73) Assignee: Visteon Global Technologies, Inc., Van Buren Township, MI (US)

( * ) Notice: Subject to any disclaimer, the term of this patent is extended or adjusted under 35 U.S.C. 154(b) by 138 days.

(21) Appl. No.: 14/361,967

(22) PCT Filed: Nov. 30, 2012

(86) PCT No.: PCT/EP2012/074123
§ 371 (c)(1),
(2) Date: May 30, 2014

(87) PCT Pub. No.: WO2013/079675
PCT Pub. Date: Jun. 6, 2013

(65) Prior Publication Data
US 2014/0340612 A1    Nov. 20, 2014

(30) Foreign Application Priority Data

Dec. 2, 2011  (DE) .................. 10 2011 120 052
May 29, 2012  (FR) ..................... 12 01536

(51) Int. Cl.
*G02F 1/1333*  (2006.01)
*B60R 11/02*  (2006.01)
(Continued)

(52) U.S. Cl.
CPC .......... *B60R 11/0229* (2013.01); *B60K 35/00* (2013.01); *G02F 1/133308* (2013.01);
(Continued)

(58) Field of Classification Search
USPC ......................................... 349/58
See application file for complete search history.

(56) References Cited

U.S. PATENT DOCUMENTS

| | | | |
|---|---|---|---|
| 2002/0086645 A1 | 7/2002 | Flegeo | |
| 2006/0034041 A1 | 2/2006 | Lo et al. | |
| 2006/0066772 A1* | 3/2006 | Takahashi | G02F 1/133308 349/60 |
| 2006/0098134 A1 | 5/2006 | Park et al. | |
| 2011/0012931 A1 | 1/2011 | Abe | |
| 2011/0248626 A1* | 10/2011 | Matsudate | H01L 51/5237 313/504 |

FOREIGN PATENT DOCUMENTS

| | | |
|---|---|---|
| FR | 2674295 A1 | 9/1992 |
| JP | 2001-021973 A | 1/2001 |

(Continued)

OTHER PUBLICATIONS

International Preliminary Report on Patentability and Written Opinion in PCT/EP2012/074123 dated Jun. 3, 2014, 5 pages.

(Continued)

*Primary Examiner* — Phu Vu
(74) *Attorney, Agent, or Firm* — Foley & Lardner LLP

(57) ABSTRACT

A positioning and securing device positions and secures a display element with respect to a housing, the display element being substantially located in a main extension plane and abutting the housing in a direction perpendicular to the main extension plane. The positioning and securing device is substantially located in another main extension plane parallel to the main extension plane of the display element. The positioning and securing device includes at least one first compression element abutting the display element and also at least one second compression element abutting the housing. A display device of an automobile can include the positioning and securing device.

6 Claims, 2 Drawing Sheets

(51) Int. Cl.
*B60K 35/00* (2006.01)
*G06F 1/16* (2006.01)
*H05K 5/00* (2006.01)
*H05K 5/02* (2006.01)

(52) U.S. Cl.
CPC ......... *G06F 1/1601* (2013.01); *H05K 5/0017* (2013.01); *H05K 5/0217* (2013.01); *B60K 2350/106* (2013.01); *B60K 2350/941* (2013.01); *B60R 11/0235* (2013.01); *G02F 2001/133322* (2013.01); *G06F 2200/1612* (2013.01)

(56) References Cited

FOREIGN PATENT DOCUMENTS

| | | |
|---|---|---|
| JP | 2003-157022 A | 5/2003 |
| JP | 2005-115274 A | 4/2005 |

OTHER PUBLICATIONS

International Search Report in PCT/EP2012/074123 dated Jun. 24, 2013.
Office Action dated Aug. 30, 2016, received in corresponding Japanese application No. 2014-543919 (4 pages) and English translation (3 pages).

* cited by examiner

DEVICE FOR POSITIONING AND SECURING A DISPLAY ELEMENT AND DISPLAY DEVICE

CROSS REFERENCE TO RELATED APPLICATIONS

The present application is a U.S. National Stage of International Application No. PCT/EP2012/074123 filed on Nov. 30, 2012, which claims the benefit of German Patent Application No. 10 2011 120 052.9 filed on Dec. 2, 2011 and French Patent Application No. 12/01536 filed on May 29, 2012, the entire disclosures of all of which are incorporated herein by reference.

The present invention relates to a device for positioning and securing a display element and to a display device, in particular for an automobile, comprising such a positioning and securing device.

Positioning and securing devices are known, for example from French Patent Application No. FR 2674295 A1. This publication proposes the provision of a block of flexible material intended to support an element in an appliance, the block/element assembly being clamped between a first support and a second support, the supports comprising means for positioning the block and means for positioning the element, the supports also comprising means for securing them to one another.

One drawback of such a device according to the prior art consists in the need to provide a multitude of different elements and pieces, which makes the production of such a device relatively expensive and bulky, and increases the weight of such a device.

Another drawback of such a device according to the prior art is the assembly time, which increases according to the number of mating pieces to be assembled.

Furthermore, display devices arranged on or in an interior equipment part of a vehicle, for example a dashboard or a central console, are known in the prior art. A display device generally comprises a display element intended to display information, and a conductor paned/electronic printed circuit board coupled to the display element and provided with a connection arrangement used to operate the display element. The display element is most of the time surrounded in its border region with a housing closure element (or diaphragm element). The display element may, for example, be in the form of a liquid-crystal screen, in particular a screen of the TFT type (thin-film transistor). TFT screens comprise a matrix composed of thin-film transistors and make it possible to obtain a display element with good optical quality for a user.

It is an object of the present invention, in particular, to overcome the drawbacks of the prior art, particularly those mentioned above, and it is also an object to provide a device for positioning and securing a display element which is easy to assemble and ensures increased stability during the period of use of the display device.

According to the invention, this object is achieved by a device for positioning and securing a display element with respect to a housing, the display element being essentially localized in one main extension plane and abutting with the housing in a direction perpendicular to the main extension plane, the positioning and securing device being essentially localized in another main extension plane parallel so the main extension pane of the display element, the positioning and securing device comprising at least one first compression element abutting against the display element, as well as at least one second compression element abutting against the housing.

With such a positioning and securing device, it is advantageously possible to position and secure the display element in a straightforward way with a single piece, which makes mounting of the display element simple and inexpensive.

The object according to the invention is achieved by a display device comprising a display element used so represent information and a conductor panel/electronic printed circuit board coupled to the display element and used to operate the display element, the display element being surrounded in its border region with a closure element (or diaphragm element) arranged in a housing, and a securing and/or holding element placed between the display element and the conductor panel, holding the display element in a defined position with respect to the conductor panel and the housing. The securing and/or holding element has a flexible form at least in certain segments. It is preferably in the form of a spring element, in particular a leaf spring, and in at least some segments has a curved profile with a zigzag shape in the horizontal plane, in contact with a lower side, in the viewing direction, of the display element and with an upper side, in the viewing direction, of the conductor panel. It is particularly preferred for the securing and/or holding element to be made of metal, for example stainless steel.

Toolless mounting of the display element, is advantageously made possible between the housing and the conductor panel by virtue of the securing and/or holding element, so that no additional securing element is necessary for arranging the display element in she display device and the housing. To this end, the display element is delimited by the securing and/or holding element in the direction of the conductor panel, that is to say downward in the viewing direction, and by the closure element in the direction of the housing, that is to say upward in the viewing direction, and is thus held in place optimally. Managing the cost and the complexity of the display device makes it possible to make its manufacture more economical.

According to a preferred embodiment, the positioning and securing device is made of an electrically conductive material, in particular a metal or a metal alloy.

The advantage of making the positioning and securing device from an electrically conductive material is that it is thus possible to protect the display element from the detrimental effects of electrical discharges, in particular electrostatic discharges.

A preferred improvement of the invention is that the first compression element and the second compression element are connected to one another in the manner of a leaf spring.

Thus, according to the present invention, it is advantageously possible to carry out simple and durable securing of the display element in the housing of the display device.

According to other preferred embodiments:
a plurality of first compression elements and one second compression element are connected in the manner of a meander, particularly in the form of a folded spring clip.
a plurality of second compression elements and one first compression element are connected in the manner of a meander, particularly in the form of a folded spring clip.

By such production of the positioning and securing device, it is advantageously possible to produce the positioning and securing device straightforwardly and inexpensively.

A preferred improvement of the invention is also that the positioning and securing device forms a frame.

According to the present invention, it is advantageously possible to provide not only securing which is compatible with rapid mounting, but also securing without rattling noise, and a possibility of electrical contact between the positioning and securing device and the display element.

According to yet another preferred embodiment, the positioning and securing device is provided, as a rectangular frame.

A preferred improvement of the invention is also that the display element abuts with a diaphragm of the housing in a direction perpendicular to the main extension plane.

By such production of the positioning and securing device, it is advantageously possible to carry out simple mounting despite the fact that the display element is fixed relative to the positioning and securing device.

The present invention also relates to a display device, in particular for an automobile, the display device comprising a display element, a housing and a positioning and securing device according to the present invention.

A preferred improvement of the invention is also that the display element comprises at least one electroluminescent element of the thin-film transistor type (TFT) or a liquid-crystal electroluminescent element (LCD, liquid crystal display).

Other characteristics and advantages of the invention will become apparent on reading the following description of a particular nonlimiting embodiment of the invention.

BRIEF DESCRIPTION OF THE DRAWINGS

The invention will be understood better from the following description, which relates to preferred embodiments given as nonlimiting examples and explained with reference to the appended schematic drawings, in which.

DESCRIPTION OF THE DRAWINGS

The corresponding parts are associated with the same references throughout the figures.

Figure 1:
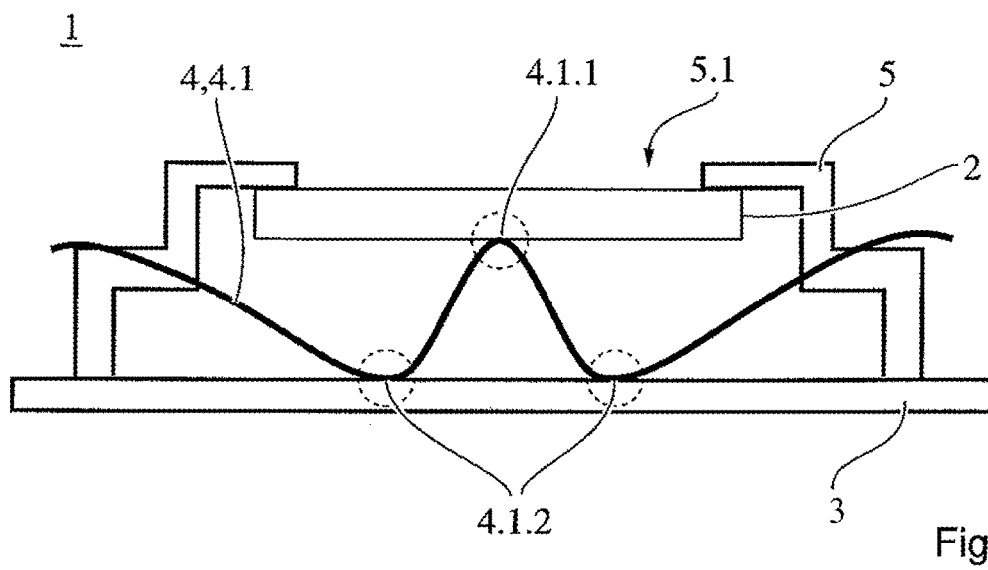
FIG. 1 is a sectional representation of a positioning and securing device assembled with a display element according to the present invention.

FIG. 1 illustrates a sectional representation of a display device 1 according to the invention, comprising a display element 2, a conductor panel 3 (also referred to below as an electronic printed circuit board 3) and a securing and/or holding element 4 (also referred to below as a positioning and securing element 4).

The display device 1 may preferably be arranged in a vehicle, for example in a dashboard or a central console, and is used to acquire and/or display information intended for a user. The display device 1 makes it possible, for example, to produce an image display for a navigation system placed in a vehicle.

In the present example, the display element 2 is in the form of a flat element which can display information on the front side, that is to say a side facing toward an observer, as a function of received electrical signals. The display element 2 may for example be in the form of a liquid-crystal screen, in particular a screen of the TFT type (thin-film transistor). TFT screens comprise a matrix composed of thin-film transistors and make it possible to obtain a display element 2 with good optical quality for a user.

The electrical signals as well as a supply voltage, which are intended for the display element 2, are provided to the conductor panel 3 by means of an electrical connection arrangement. To this end, the conductor panel 3 is arranged below the display element 2, parallel in the viewing direction, and is coupled thereto on the electrical plane (in a way which is not represented) by means of a cable. In order to do this, the conductor panel 3 comprises electrical and electronic components making it possible to operate the display element 2.

In the present exemplary embodiment, the securing and/or holding element (that is to say the positioning and securing device) 4, which is in the form of a leaf spring 4.1, is arranged between the display element 2 and the conductor panel 3, said spring having a profile curved inward in a zigzag in the horizontal plane at least, in certain segments. The leaf spring 4.1/the positioning and securing device 4.1 is preferably made of metal, for example stainless steel. Here, she points 4.1.1 (also referred to as first compression element 4.1.1), oriented toward the display element 2, of the leaf spring 4.1 curved inward in a zigzag come into contact with a rear side of the display element 2, that is to say a lower side, in the viewing direction, of the display element 2, and the points 4.1.2 (also referred to as second compression element 4.1.2), oriented toward the conductor panel, of the leaf spring 4.1 curved inward in a zigzag come into contact with an upper side of the conductor panel 3. The leaf spring 4.1 may in this case particularly preferably be arranged in the display device L1 without an additional securing means. Here, the points 4.1.1 of the leaf spring 4.1 preferably have a rounded shape.

Figure 2:
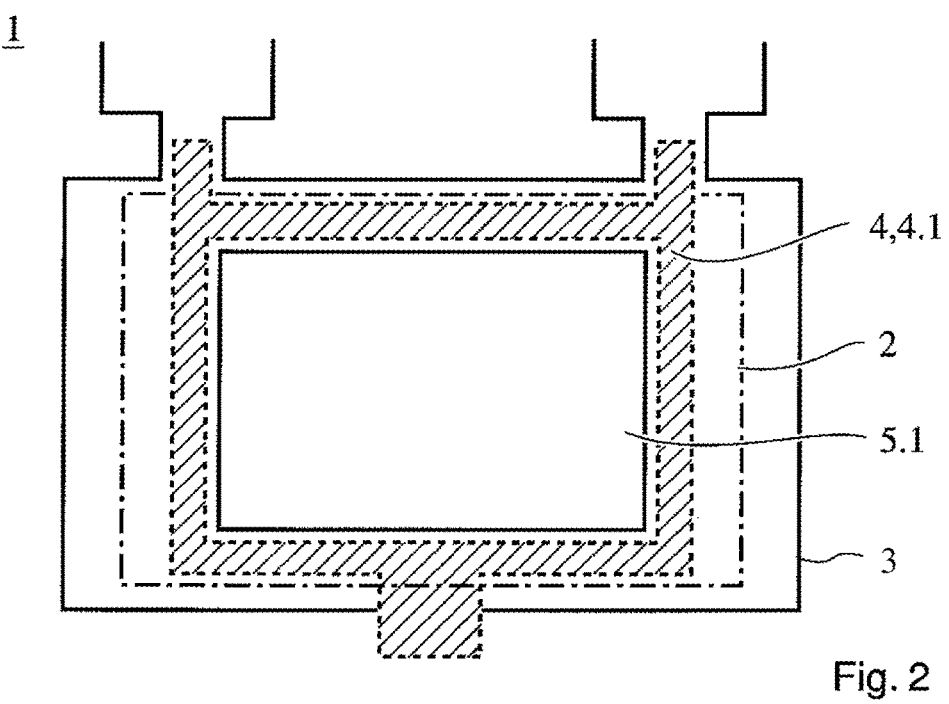
FIG. 2 is an elevation representation of a display device with a display element and a positioning and securing device according to a first embodiment of the present invention.
Figure 3:
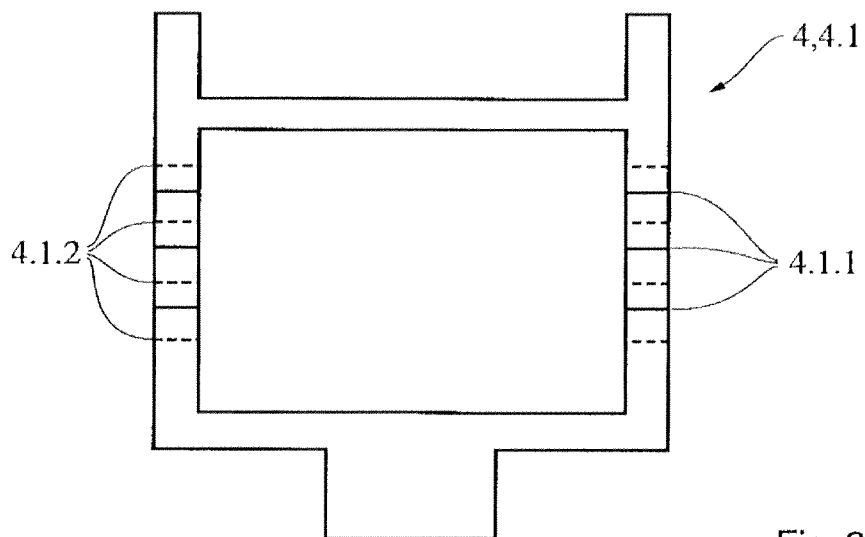
FIG. 3 is an elevation representation positioning and securing device according to a first embodiment according to the present invention.
Figure 4:
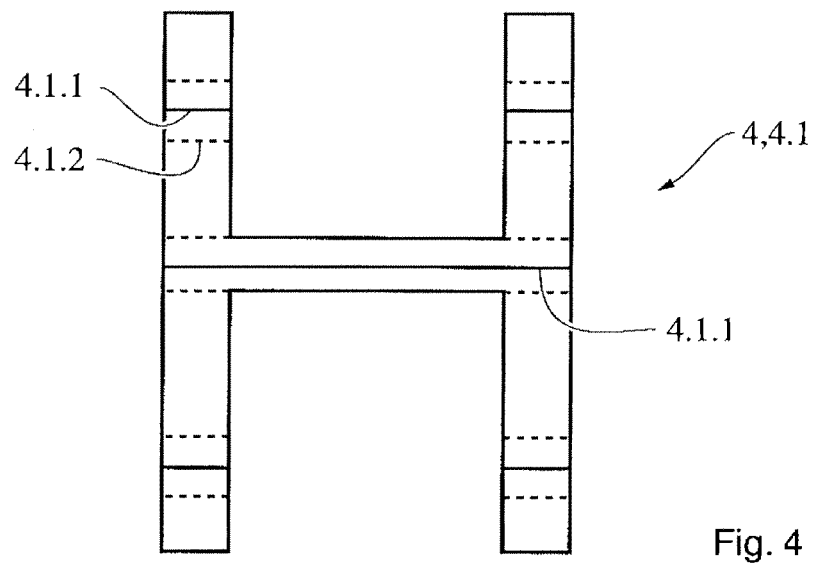
FIG. 4 is an elevation representation of positioning and securing device according to a second embodiment according to the present invention.

The leaf spring 4.1 (represented by hatching in FIG. 2) is in this case made, according to a first embodiment which is represented in FIGS. 2 and 3, so as to correspond to a peripheral border region of the display element 2, so that in elevation view this region has an approximately tetrahedral shape with corresponding roundings provided in an outer peripheral region. In an alternative embodiment which is illustrated in FIG. 4, the leaf spring 4.1 is formed in certain segments so as to correspond to a peripheral border region of the display element 2, having the shape of an H in elevation view.

The leaf spring 4.1 is preferably in the form of a component made in one piece, and can be manufactured easily and inexpensively, for example by means of a pressing process. As a variant, the leaf spring 4.1 is formed by a force and/or form and/or material, fit from a plurality of parts connected together.

The display element 2, the conductor panel 3 and the securing and/or holding element 4 are arranged in a housing 5 which, in the present exemplary embodiment, is in the form of a vehicle dashboard console light box.

The housing 5 has a peripheral step, the second level having a smaller outer periphery than the first level. A recess in the form of a closure element 5.1 is arranged on the second level, the periphery of said recess being smaller than the outer periphery of the display element 2.

The display element 2 is arranged under the closure element in the viewing direction. The display element 2 is delimited in the direction of the conductor panel 3, that is to say downward in the viewing direction, by means of the securing and/or holding element 4, and in the direction of the housing 5, that is to say upward in the viewing direction, by means of the closure element 5.1, which allows is so be held in place optimally.

Toolless mounting of the display element 2 in the display device 1 is thus advantageously made possible by the securing and/or holding element 4, thus making superfluous the use of additional securing elements for establishing a force-fit connection of the display element 2 to the housing 5.

As a variant or in addition, the housing 5 may comprise material recesses on the inner side, for example in the form of notches, in which sections of the securing and/or holding element 4 are arranged. The display element 2 may then also be held in place when the conductor panel 3 is compressed, for example downward in the viewing direction, and when the points 4.1.2 oriented toward the conductor plate 3 no longer touch the upper side of the conductor panel 3.

LIST OF REFERENCES

1 display device
2 display element
3 conductor panel/electronic printed circuit board
4 securing and/or holding element
4.1 leaf spring
4.1.1 points/first compression element(s)
4.1.2 points/second compression element(s)
5 housing
5.1 closure element/diaphragm

The invention claimed is:

1. A device for positioning and securing a display element with respect to a housing and an electronic printed circuit board, the display element being essentially localized in one main extension plane and abutting with the housing in a direction perpendicular to the main extension plane, the positioning and securing device being essentially localized in another main extension plane parallel to the main extension plane of the display element, wherein the positioning and securing device comprises at least one first compression element abutting against a rear side of the display element, as well as at least one second compression element abutting against an upper side of the electronic printed circuit board;
  wherein the positioning and securing device is made of an electrically conductive material, wherein the first compression element and the second compression element are connected to one another in the manner of a leaf spring, wherein a plurality of first compression elements and one second compression element are connected in the manner of a meander in the form of a folded spring clip.

2. The positioning and securing device as claimed in claim 1, wherein the positioning and securing device forms a frame.

3. The positioning and securing device as claimed in claim 1, wherein the positioning and securing device is provided as a rectangular frame.

4. The positioning and securing device as claimed in claim 1, wherein the display element abuts with a diaphragm of the housing in a direction perpendicular to the main extension plane.

5. A display device, in particular for an automobile, wherein the display device comprises a positioning and securing device as claimed in claim 1, and the display device comprises a display element and a housing and an electronic printed circuit board.

6. The display device as claimed in claim 5, wherein the display element comprises at least one electroluminescent element of the thin-film transistor type or a liquid-crystal electroluminescent element.

* * * * *